US012612302B2

(12) United States Patent
Nagel

(10) Patent No.: US 12,612,302 B2
(45) Date of Patent: Apr. 28, 2026

(54) MICROMECHANICAL Z-ACCELERATION SENSOR

(71) Applicant: Robert Bosch GmbH, Stuttgart (DE)

(72) Inventor: Cristian Nagel, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 334 days.

(21) Appl. No.: 18/538,538

(22) Filed: Dec. 13, 2023

(65) Prior Publication Data

US 2024/0199409 A1 Jun. 20, 2024

(51) Int. Cl.
*B81B 3/00* (2006.01)

(52) U.S. Cl.
CPC .... *B81B 3/0081* (2013.01); *B81B 2201/0235* (2013.01); *B81B 2203/0353* (2013.01); *B81B 2203/053* (2013.01)

(58) Field of Classification Search
CPC ...... B81B 2201/025; B81B 2201/0235; B81B 2201/0242; B81B 2201/0228; B81B 2203/0353; B81B 3/0081
See application file for complete search history.

(56) References Cited

U.S. PATENT DOCUMENTS

| | | | |
|---|---|---|---|
| 2010/0122578 A1* | 5/2010 | Classen | G01P 15/0802 |
| | | | 73/514.32 |
| 2018/0238926 A1* | 8/2018 | Shiota | B81C 3/00 |
| 2018/0252745 A1 | 9/2018 | Isobe et al. | |
| 2021/0123944 A1 | 4/2021 | Tanaka | |
| 2022/0091155 A1* | 3/2022 | Rambach | G01P 21/00 |

FOREIGN PATENT DOCUMENTS

| | | |
|---|---|---|
| DE | 102020211924 A1 | 3/2022 |
| EP | 0244581 A1 | 11/1987 |
| EP | 0773443 A1 | 5/1997 |

* cited by examiner

*Primary Examiner* — Nathaniel J Kolb
(74) *Attorney, Agent, or Firm* — NORTON ROSE FULBRIGHT US LLP

(57) ABSTRACT

A micromechanical z-acceleration sensor. The sensor has a substrate with a main extension plane, and a micromechanical rocker which is arranged parallel to the extension plane above the substrate and can be tilted in a first direction z perpendicular to the extension plane, wherein the rocker in a first partial region: has first perforations, which extend through the rocker in the first direction z, with a first cross-section parallel to the main extension plane with a first aspect ratio of at least 1:1; and has second perforations, which extend through the rocker in the first direction z, with a second cross-section with a second aspect ratio of a longer side to a shorter side, wherein the first aspect ratio is smaller than the second aspect ratio. A first perforation and a second perforation are arranged alternately next to one another in a repeating pattern.

4 Claims, 3 Drawing Sheets

MICROMECHANICAL Z-ACCELERATION SENSOR

CROSS REFERENCE

The present application claims the benefit under 35 U.S.C. § 119 of German Patent Application No. DE 10 2022 213 826.0 filed on Dec. 19, 2022, which is expressly incorporated herein by reference in its entirety.

BACKGROUND INFORMATION

Micromechanical inertial sensors for measuring acceleration and yaw rate are mass-produced for various applications in the automotive and consumer sectors. For capacitive acceleration sensors with a detection direction perpendicular to the wafer plane (z direction), "rockers" are often used, as shown by way of example in FIG. 1 in a partially transparent oblique view. The sensor principle of these rockers is based on a spring-mass system, in which a movable seismic mass with two counter-electrodes fastened to the substrate and two counter-electrodes located in the MEMS structure forms plate capacitors. The seismic mass is connected to the base via at least one but usually, for reasons of symmetry, two torsion springs. Due to the difference in mass between the "full" seismic side of the rocker and the "empty" box side of the rocker, a rotation of the sensor about the torsion spring occurs during application of a z-acceleration. The distance between the electrodes on the side with the greater mass becomes shorter and on the other side becomes longer. The capacitance change is a measure of the acting acceleration. Acceleration sensors with a rocker structure are described in numerous documents, for example in European Patent Application Nos. EP 0244581 A1 and EP 0773443 A1.

Not only accelerations but also thermal gradients can lead to a deflection of the rocker and thus to an error signal (measurement deviation). If the upper side of the sensor has a higher temperature, e.g., due to the proximity to a heat source (such as a CPU/GPU), the gas above the micromechanical structure is warmer than the gas below it. The higher the temperature of the gas, the greater is also the kinetic energy of the gas particles so that they transfer an increased momentum upon collision with the MEMS surface. An overpressure thus arises on the warmer MEMS upper side and a negative pressure is generated on the MEMS underside, which negative pressure leads to the deflection of the rockers and is described in technical literature as a radiometer effect. The corresponding error signal is an offset which arises under the influence of a temperature gradient and, for this reason, is referred to as the "Temperature Gradient Offset" (TGO).

Even a rocker that is perfectly symmetrical in plan view and has the same perforations on the seismic and box sides has a significant TGO since the layer thicknesses of these two sides are different. Due to the temperature gradient in the MEMS structure, a thermal creep movement of the gas occurs in each perforation hole, which along the perforation hole channel leads to a frictional/shearing force on the MEMS structure and thus to a deflection of the same. This gas flow causes a pressure difference between the two ends of the perforation hole channel, which acts on the MEMS upper side/underside in a A-wide strip around the hole, where A describes the mean free path length of the gas surrounding the MEMS structure. Consequently, this force component of the radiometric force acts along the edge or corner of a perforation hole, from which comes the term 'corner force' in the literature. Consequently, the radiometric (corner) force can be increased locally by adding narrow slits. The TGO slits which are inserted between the larger perforation holes are based on this principle.

Since, to put it more simply, this is a pressure difference between the upper side and underside of the MEMS, larger holes in the box side of the rocker in modern z-acceleration sensors are iteratively replaced by smaller slits (see FIG. 2). This procedure increases the existing rocker area on the empty box side so that a radiometer force of equal magnitude can be achieved on the two rocker sides and the TGO can thus be compensated.

The present invention thus proceeds from a micromechanical z-acceleration sensor with a substrate having a main extension plane (x, y), having a micro-mechanical rocker, which is arranged parallel to the extension plane above the substrate and can be tilted in a first direction z perpendicular to the extension plane, wherein, in a first partial region, the rocker has first perforations, which extend through the rocker in the first direction z, with a first cross-section parallel to the main extension plane with a first aspect ratio of at least 1:1, and wherein the rocker has second perforations, which extend through the rocker in the first direction z, with a second cross-section with a second aspect ratio of a longer side to a shorter side. Here, the first aspect ratio is smaller than the second aspect ratio.

This current optimization procedure, in which large holes are iteratively replaced by small slits, has the great disadvantage that the damping of the sensor increases significantly because the gas has to flow through smaller slits and thereby creates higher frictional forces on the MEMS surface. A high level of damping generates a high level of Brownian noise and thus significantly reduces the signal-to-noise performance of the sensor.

SUMMARY

An object of the present invention is to provide a micromechanical device that has TGO compensation with simultaneously low damping.

According to the present invention, a first perforation and a second perforation are arranged alternately next to one another in a repeating pattern. This is thus an insertion of TGO slits between the perforation holes, as shown in FIG. 3. For this purpose, it is helpful to know that the radiometric force increases as a result of the addition of slits, since increased local pressure differences occur at the edge of each slit. The entire radiometric force on the empty box side of the rocker is thus significantly increased so that fewer holes need to be replaced and the damping remains low.

The present invention thus enables TGO compensation with which significantly fewer holes have to be replaced by slits, which in turn enables lower damping and thus a better signal-to-noise ratio.

DETAILED DESCRIPTION OF EXAMPLE EMBODIMENTS

Figure 1:
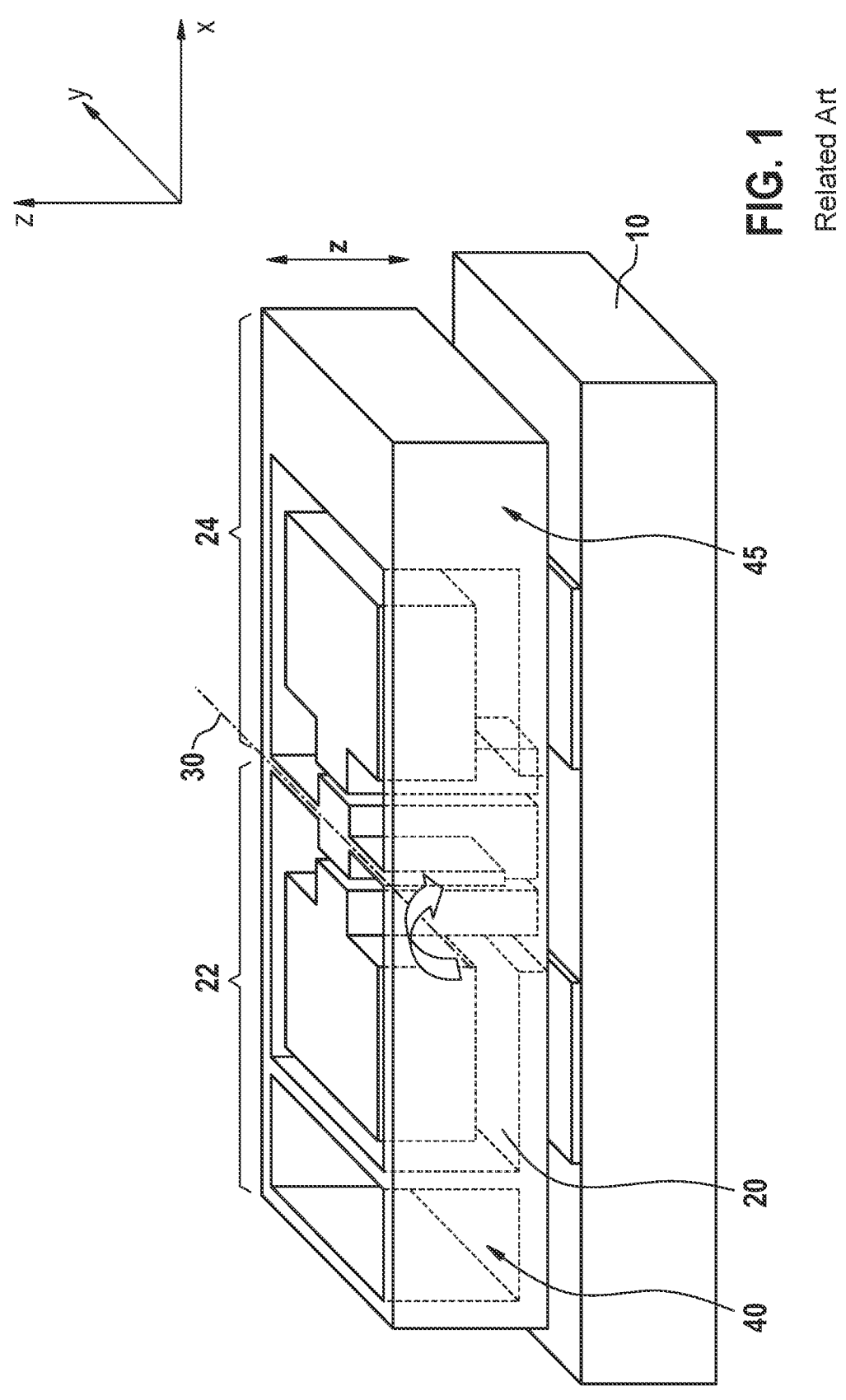
FIG. 1 shows a micromechanical z-acceleration sensor in the related art.

FIG. 1 shows a micromechanical z-acceleration sensor in the related art. Above a substrate 10 with a main extension plane (x, y), the sensor has a seismic mass in the form of a rocker 20 with a torsion axis 30. Perpendicularly to the torsion axis in the direction x, the rocker has, on both sides, rocker arms 22 and 24 of equal length which also extend equally far in the direction y parallel to the torsion axis. One rocker arm has a first partial region 40, namely an empty, open box. The other rocker arm has a second partial region 45, a solid filled box. The rocker thus has a lower thickness in the first partial region and thus a lower mass for the same area than in the second partial region. In this way, with a symmetrical design of the two rocker arms in the x and y directions, an asymmetrical mass distribution on the two sides of the rotation axis is achieved. Accelerations of the sensor in the z direction lead to a deflection of the rocker about the torsion axis.

Figure 2:
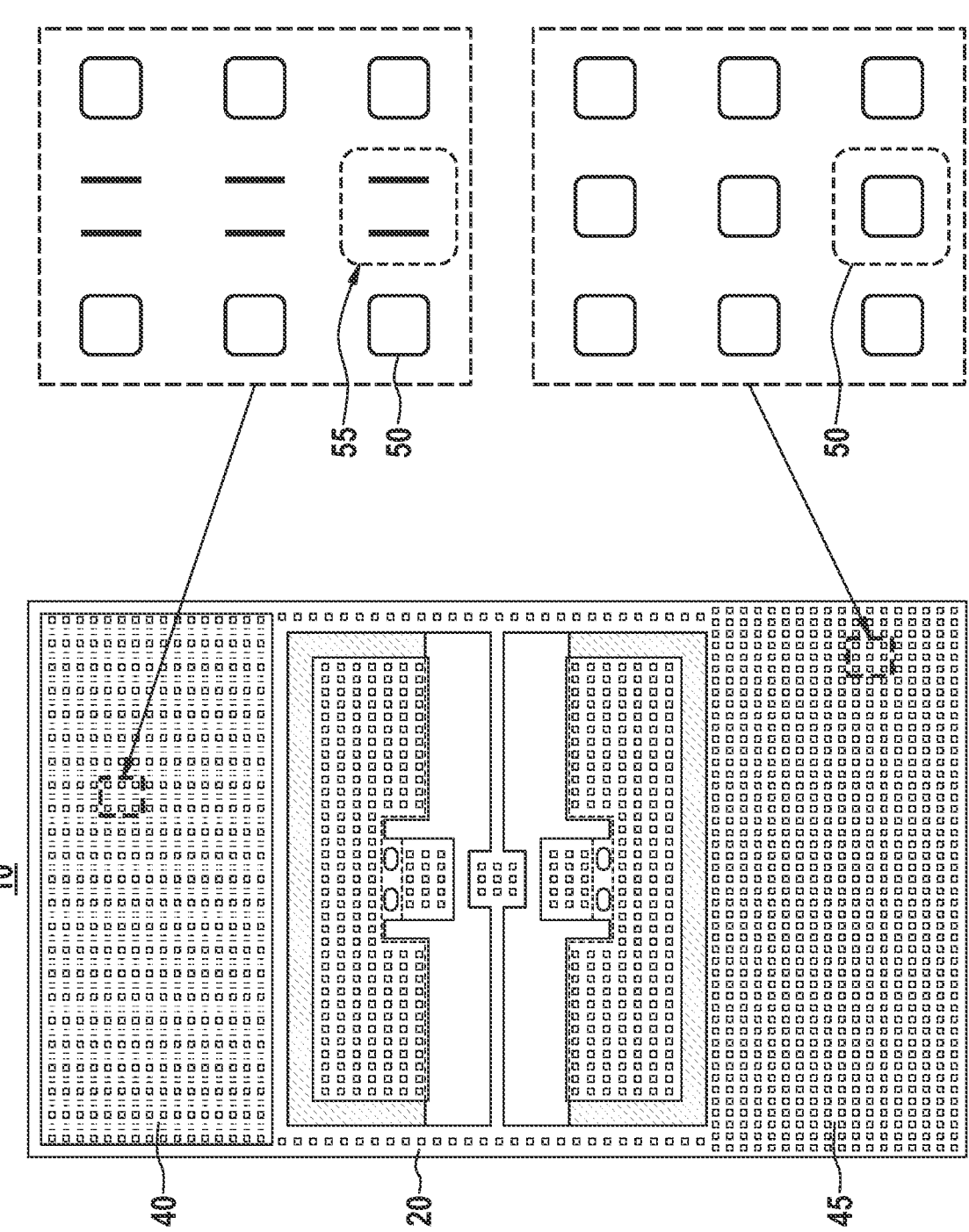
FIG. 2 shows a micromechanical z-acceleration sensor in the related art with and without TGO-compensated perforation.

FIG. 2 shows a micromechanical z-acceleration sensor in the related art with and without TGO-compensated perforation.

Shown in plan view is a micro-mechanical z-acceleration sensor having a substrate 10 with a main extension plane (x, y), having a micromechanical rocker 20, which is arranged parallel to the extension plane above the substrate and can be tilted in a first direction z perpendicular to the extension plane, wherein, in a first partial region 40, namely an empty box, the rocker has first perforations 50, which extend through the rocker in the first direction z, with a first cross-section parallel to the main extension plane with a first aspect ratio of at least 1:1, i.e., quadratic. In a common grid, some of these first perforations are exchanged for second perforations 55, which extend through the rocker in the first direction z, with a second cross-section with a second aspect ratio of a longer side to a shorter side, said ratio being larger. That is to say, the second cross-section is elongated, and the second perforations are thus slit-shaped. The first aspect ratio is thus smaller than the second aspect ratio.

Figure 3:
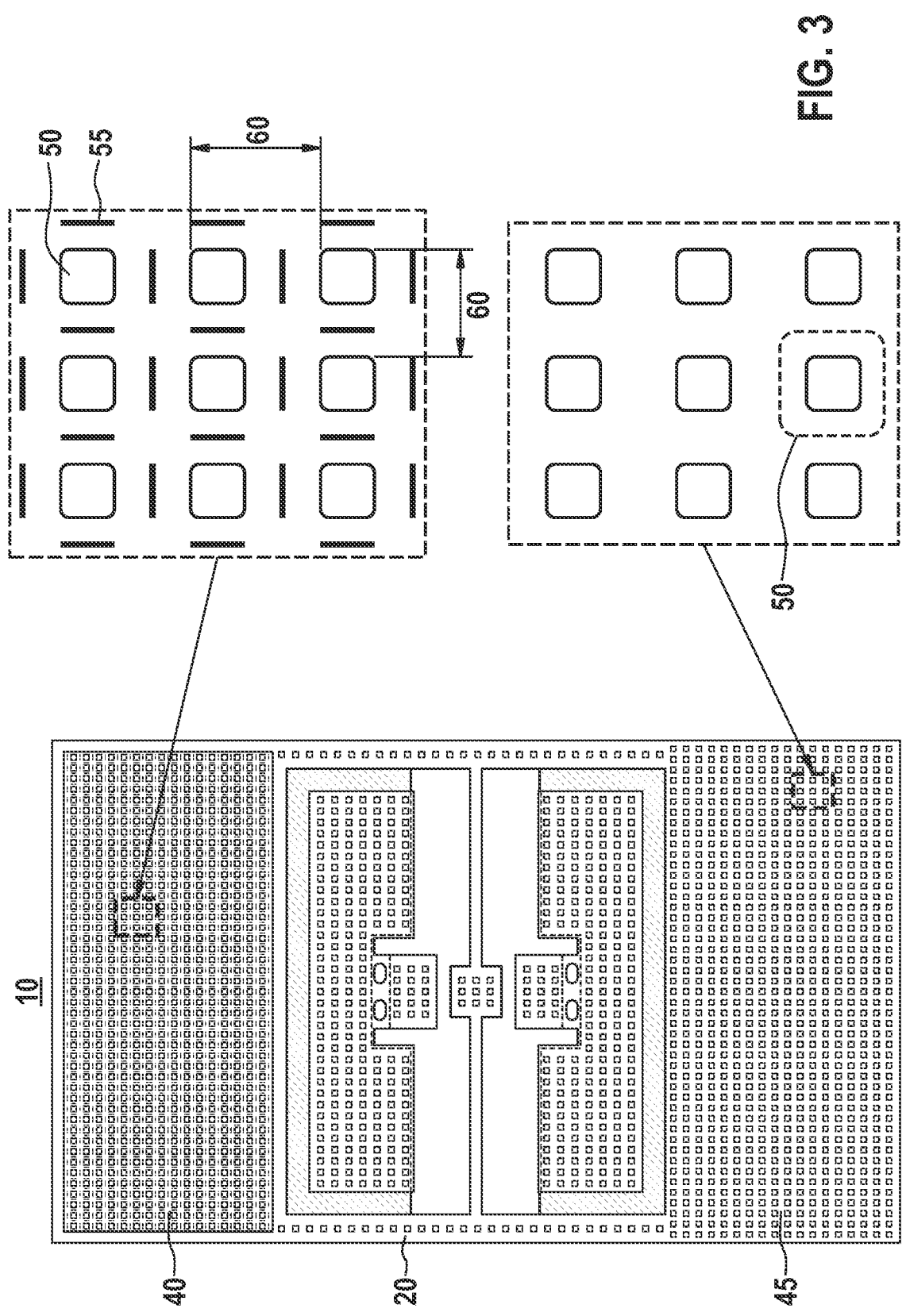
FIG. 3 shows a micromechanical z-acceleration sensor according to an example embodiment of the present invention with and without TGO-compensated perforation and compensated damping.

FIG. 3 shows a micromechanical z-acceleration sensor according to the present invention with and without TGO-compensated perforation and compensated damping.

In contrast to the device in FIG. 2, a first perforation and a second perforation are now arranged alternately next to one another in a repeating pattern. The first perforations 50 are arranged in a grid 60, and the second perforations 55 are arranged in intermediate spaces of this grid.

The pattern according to the present invention of first and second perforations is arranged in the first partial region 40 of the rocker, namely in the empty box. The first partial region has a smaller thickness than a second partial region 45, namely the seismic mass in the form of the filled box.

As FIG. 3 shows, TGO slits are inserted between the first perforation holes, which are arranged at usually regular intervals between one another. In this case, the TGO slits can be of single-row or multi-row design. The length of the slits can vary, but the width is in the range of 0.4-1 μm and is decisive for the functional principle.

The perforation pattern proposed in the figure consists of a repeating structure consisting of a larger hole of preferably $3 \times 4$ μm² to $8 \times 8$ μm² which is placed in the middle and surrounded by 4 thinner slits, preferably with a width of 0.4-1 μm at a length of 3-10 μm. The resulting perforation pattern has a grid spacing 60 of the first perforation holes in the range of 7-15 μm. These perforation patterns can be used in a MEMS structure several times with different hole sizes, slit sizes, and grid spacings. The pattern according to the present invention of first and second perforations can also be interrupted in regions by other structures or perforations, such as uninterrupted rows of slits.

Furthermore, the TGO slits can be arranged not only collinearly or even parallel, but also perpendicularly to one another.

LIST OF REFERENCE SIGNS

10 Substrate
20 Rocker
22 First rocker arm
24 Second rocker arm
30 Torsion axis
40 First partial region (empty box)
45 Second partial region (solid, filled box)
50 First perforation (perforation hole)
55 Second perforation (perforation slit)
60 Grid spacing

What is claimed is:

1. A micromechanical z-acceleration sensor, comprising:
   a substrate with a main extension plane; and
   a micromechanical rocker which is arranged parallel to the main extension plane above the substrate and can be tilted in a first direction perpendicular to the main extension plane, wherein the rocker in a first partial region includes:
   first perforations, which extend through the rocker in the first direction, with a first cross-section parallel to the main extension plane with a first aspect ratio of at least 1:1, and
   second perforations, which extend through the rocker in the first direction, with a second cross-section with a second aspect ratio of a longer side to a shorter side,
   wherein the first aspect ratio is smaller than the second aspect ratio,
   wherein a first perforation and a second perforation are arranged alternately next to one another in a repeating pattern.

2. The micromechanical z-acceleration sensor according to claim 1, wherein the first perforations are arranged in a grid with a grid spacing, and the second perforations are arranged in intermediate spaces of the grid.

3. The micromechanical z-acceleration sensor according to claim 1, wherein the first partial region has a smaller thickness than a second partial region of the rocker.

4. The micromechanical z-acceleration sensor according to claim 2, wherein the grid has a grid spacing of the first perforations of 7 to 15 μm, the first perforations have a cross-section of $4 \times 3$ μm to $8 \times 8$ μm, and the second perforations have a longer side of 3 to 10 μm in length and a shorter side of 0.4 to 1 μm in width.

* * * * *